(12) United States Patent
Osakabe

(10) Patent No.: US 6,226,133 B1
(45) Date of Patent: May 1, 2001

(54) OPTICAL APPARATUS AND A METHOD OF TRANSPORTING THE SAME

(75) Inventor: Yuichi Osakabe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/456,286

(22) Filed: Dec. 8, 1999

(30) Foreign Application Priority Data

Dec. 28, 1998 (JP) .................................................. 10-377079

(51) Int. Cl.[7] ................... G02B 7/02; H01J 3/14
(52) U.S. Cl. ....................... 359/811; 359/811; 250/216
(58) Field of Search ................... 359/618, 622, 359/637, 649, 811; 355/53, 67, 77; 250/339.13, 548, 216

(56) References Cited

U.S. PATENT DOCUMENTS

| 5,347,561 | * | 9/1994 | Ebinuma ................................. 378/34 |
| 5,559,584 | * | 9/1996 | Miyaji et al. ........................... 355/73 |
| 5,602,683 | * | 2/1997 | Straaijer et al. ...................... 359/811 |
| 6,038,015 | * | 3/2000 | Kawata ................................... 355/67 |

FOREIGN PATENT DOCUMENTS

| 4-061316 | | 2/1992 | (JP) . |
| 406201992 | * | 7/1994 | (JP) .............................. G02B/13/24 |
| 9-162117 | | 6/1997 | (JP) . |

* cited by examiner

Primary Examiner—Georgia Epps
Assistant Examiner—David Seyrafi
(74) Attorney, Agent, or Firm—Fitzpatrick, Cella, Harper & Scinto

(57) ABSTRACT

An optical apparatus includes an optical system having optical elements, an enclosure, enclosing the optical system, for keeping a gas-tight environment inside the enclosure, and a pressure absorber which absorbs variations in differential pressure between the inside and the outside of the enclosure, while maintaining the gas-tight environment in the enclosure during at least one of transportation and storage of the optical apparatus. The optical system is one of a projection optical system and an illumination optical system of an exposure apparatus, and the inside of the enclosure is filled with one of an inert gas and a low-oxygen content gas.

30 Claims, 7 Drawing Sheets

OPTICAL APPARATUS AND A METHOD OF TRANSPORTING THE SAME

BACKGROUND OF THE INVENTION

1. Field of the Invention

The present invention generally relates to an optical apparatus such as an optical system or an exposure apparatus, and a method of transporting or storing the optical apparatus. The exposure apparatus is preferably used in a lithography process for manufacturing micro-devices.

2. Description of the Related Art

In a conventional exposure apparatus, a wavelength of exposure light has been becoming shorter in order to obtain more precise resolution in exposure operations. Also, for the purpose of achieving a higher throughput (i.e., a processing ability per unit time) during an exposure operation, a higher power light source has been required. For example, light of g-line (436 nm), i-line (365 nm), and a KrF excimer laser (248 nm) are popular, and an ArF excimer laser (193 nm), an $F_2$ excimer laser (158 nm) and X-rays are going to be used in the near future.

However, it is known that shorter wavelength light tends to cause a photocatalyst resulting from a reaction of contaminants included in the atmosphere with oxygen, especially when using i-line or shorter wavelength light beams. The photocatalyst generates a reaction product (clouding material) which easily attaches to the surface of the optical elements of an exposure apparatus. Namely, the optical elements, e.g., glass lenses or mirrors, will have a clouded portion that decreases the glass transparency or mirror reflectivity. For example, sulfurous acid ($SO_2$ in water) absorbs exposure light energy in an excited state and can cause a reaction with oxygen (oxidation reaction), nitrogen and any surrounding moisture content. As a result of the reaction, ammonium sulfate $(NH_4)_2SO_4$ will be produced. Ammonium sulfate, being opaque white and causing the exposure light to be scattered or absorbed, may become the clouding material on the optical elements, which degrades the optical properties of the optical elements.

Particularly, in the short wavelength region under i-line, i.e., in an excimer laser wavelength, the exposure light accelerates the chemical reaction to produce the clouding material. Also, the exposure light reacts with oxygen in the air to produce ozone. As a result, it is a known phenomenon that the remaining oxygen and the produced ozone absorb the exposure light. Hence, the reduction in the amount of the light on the wafer causes a necessity of increasing the exposure time, which means a lowering of the throughput.

It is possible to wipe or otherwise clean the deposited clouding material off of the lenses, because the material is water-soluble. However, to perform the cleaning, it is necessary to disassemble the optical elements which are held with ultra-high precision, and this will significantly increase the maintenance time and cause other difficulties.

Japanese Laid-Open Patent Application No. 9-162117 shows one solution to the problem noted above. In that document, optical systems arranged between a light source and a mask have several separated blocks, each comprising a cabinet for storing a lens barrel with optical elements. The cabinet has one window on each side to introduce and to emit the exposure light, respectively. The insides of the cabinet and the optical barrel are kept under a low-oxygen atmosphere. For this reason, the oxidation reaction of the photocatalyst is reduced so as to prevent deposition of the clouding material on the optical elements during an exposure operation.

The structure described above, however, has some points to improve. That is to say, although it is preferable to keep a higher level of airtightness in order to maintain a low-oxygen atmosphere, a differential pressure between the inside and the outside of the cabinet or the optical barrel varies (with the potential of becoming very high) according to the surrounding atmosphere.

Makers of semiconductor manufacturing apparatus supply their apparatus to manufacturing plants and research institutes located throughout the world. Therefore, they use a variety of conveying methods to transport finished products (e.g., entire exposure apparatuses) as well as units (e.g., optical system units) of the products. Air transportation is often used. Since jet planes fly at a very high altitude (e.g., at 6,000 to 12,000 m), their cabins are pressurized, but this pressure is not the same as the atmospheric pressure at the altitude on the ground. For example, if the atmospheric pressure on the ground is about 1,013 mb, the pressure at an altitude of 12,000 m is about 200 mb. In that case, the inside cabin of the flying jet plane is pressurized by about 800 mb. Further, it is known that the pressure in the cabin varies in a range of 730 to 830 mb during take off or landing. Namely, when the apparatus is transported by air, the pressure around the apparatus becomes lower than during ordinary operating times, which means the differential pressure becomes higher. That situation may cause a problem with the transported apparatus in that the windows or the optical elements may shift or, in the worst case, be damaged by the high differential pressure.

Meanwhile, in general, the inside atmosphere of clean rooms, in which the optical systems and the exposure apparatuses are put, is maintained to be under approximately the same conditions regardless of the installation, e.g., 23±3° C. in temperature and 45±5% in relative humidity. Under these conditions, if the temperature becomes 10° C. or below, the relative humidity within the airtight lens barrel or the cabinet rises to 100%, and condensation occurs. For example, when transporting the exposure apparatus by air in the wintertime, a holding cabin of an airplane can easily become under 10° C. Once condensation occurs on the surfaces of the windows or the optical elements, a nucleus of water spots (i.e., extraneous matter) will remain, even if the condensation evaporates when the temperature rises. The extraneous matter may cause harmful effects on the properties of the windows or the optical elements. Particularly, for state-of-the art exposure apparatuses having an ultra-precise optical system, some improvements are needed.

SUMMARY OF THE INVENTION

The present invention is provided to overcome the challenges discussed above, and a general object of the invention is to provide an improved optical apparatus and a transporting method that take measures against environmental variations.

According to one aspect of the present invention, an optical apparatus comprises an optical system having optical elements, an enclosure, enclosing the optical system, for keeping a gas-tight environment inside the enclosure, and a pressure absorber, attached to the enclosure, which absorbs variations in differential pressure between the inside and the outside of the enclosure, while maintaining the gas-tight environment during at least one of transportation and storage of the optical apparatus.

According to another aspect of the present invention, an optical apparatus comprises a lens barrel which holds a plurality of lenses, an attachment being capable of being attached to an end of the lens barrel in order to provide a gas-tight enclosure around an outer surface of an outermost lens, and a pressure absorber, attached to said enclosure, which absorbs variations in differential pressure between the inside and the outside of the enclosure while maintaining the gas-tight environment in the enclosure.

According to yet another aspect of the present invention, a method of transporting an optical apparatus comprises storing an optical system in a gas-tight enclosure, connecting a pressure absorber to the enclosure, the pressure absorber absorbing variations in differential pressure between the inside and the outside of the enclosure, filling the enclosure with a low-oxygen content gas, and transporting the enclosure while maintaining the gas-tight environment in the enclosure.

According to yet another aspect of the present invention, a method of transporting an optical apparatus comprises providing an optical system in a gas-tight enclosure, filling the enclosure with a dry inert gas, and transporting the enclosure while maintaining the gas-tight environment in the enclosure, under a reduced pressure environment.

These and other objects, features and advantages of the present invention will become more apparent from the following description of the preferred embodiments taken in conjunction with the accompanying drawings.

DESCRIPTION OF THE PREFERRED EMBODIMENTS

This invention will be described in further detail by way of example with reference to the accompanying drawings.

Figure 1:
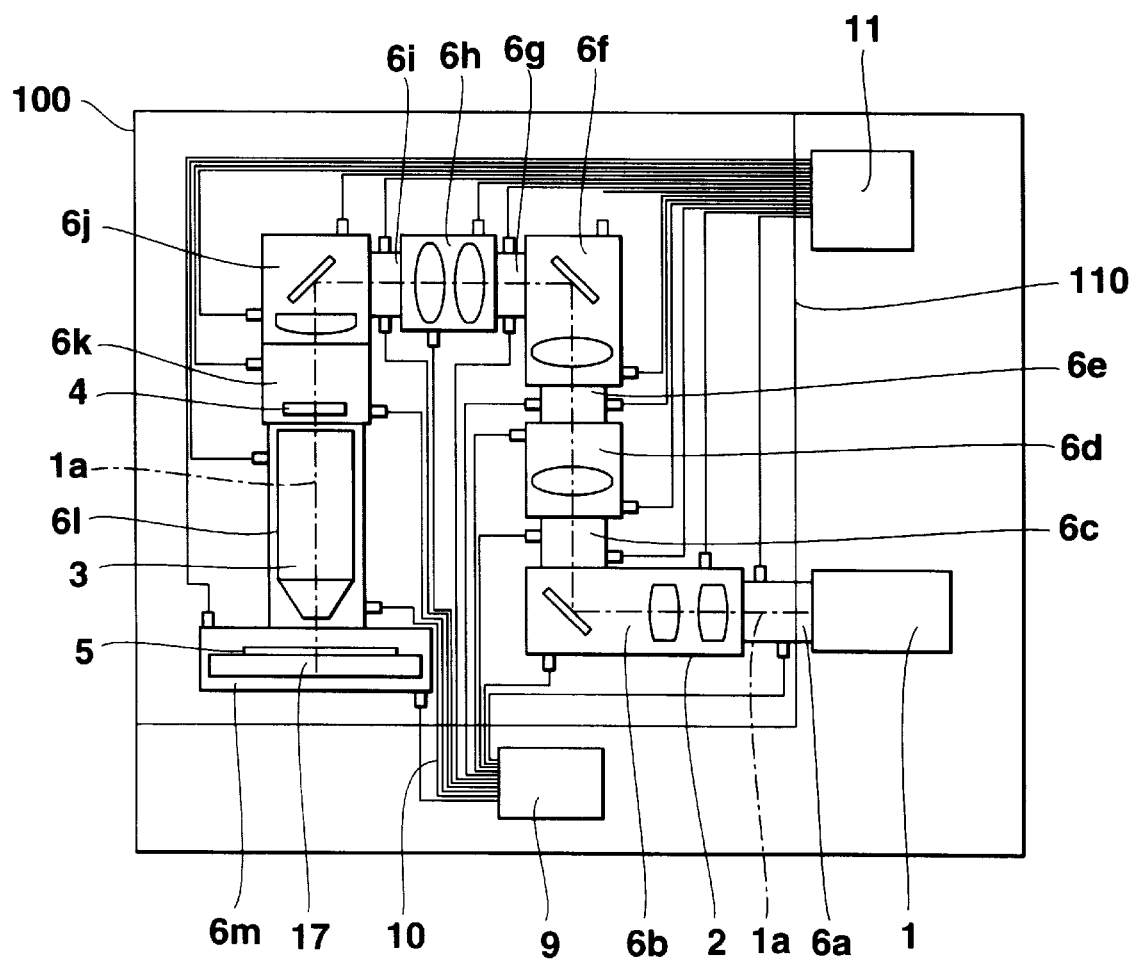
FIG. 1 shows a structure of an exposure apparatus according to an embodiment of the present invention.

FIG. 1 illustrates a structure of an exposure apparatus 100 according to an embodiment of the present invention. The exposure apparatus 100 generally includes a light source 1, an illumination optical system 2 being separated into a plurality of units, a projection optical system 3, a reticle 4 (e.g., a mask) held by a reticle stage, and a wafer stage 17 on which a wafer 5 is held. The apparatus 100 also comprises an inert gas supply tank 9, gas-passageways 10, and a gas recovery tank 11. The elements shown above, except the light source 1, the inert gas supply tank 9 and the gas recovery tank 11, are placed within a chamber 110, which is maintained at approximately the desired atmospheric conditions of 23±3° C. in temperature and 45±5% in relative humidity.

In this embodiment, the light source 1 can be an excimer laser, e.g., KrF (248 nm), ArF (193 nm) or $F_2$ (158 nm). Instead of the excimer laser, it is also possible to use an i-line light source such as a high-pressure mercury lamp. A generated ultraviolet pulsed laser beam 1a is directed into the illumination optical system 2, which includes a plurality of cabinets 6b, 6d, 6f, 6h, and 6j, each containing at least one lens barrel, which holds lenses, wherein some of the cabinets have deflecting mirrors. These cabinets 6b, 6d, 6f, 6h, and 6j are connected by gas-tight connectors 6a, 6c, 6e, 6g, and 6i. The projection optical system 3 is stored in a cabinet 61. The exposure light beam passing through the illumination optical system 2, having a predetermined shape and uniform intensity distribution, illuminates the reticle 4, stored in a cabinet 6k. A pattern image of the illuminated reticle 4 is projected by the projection optical system 3 onto the wafer 5 with a predetermined reduction scale (e.g., 5:1) by a well-known step-and-repeat method (in a still or scan manner during exposure), so as to transfer the reticle patterns onto a plurality of shot areas on the wafer 5. Each of the cabinets mentioned above is regarded as being a gas-tight enclosure.

Figure 2:
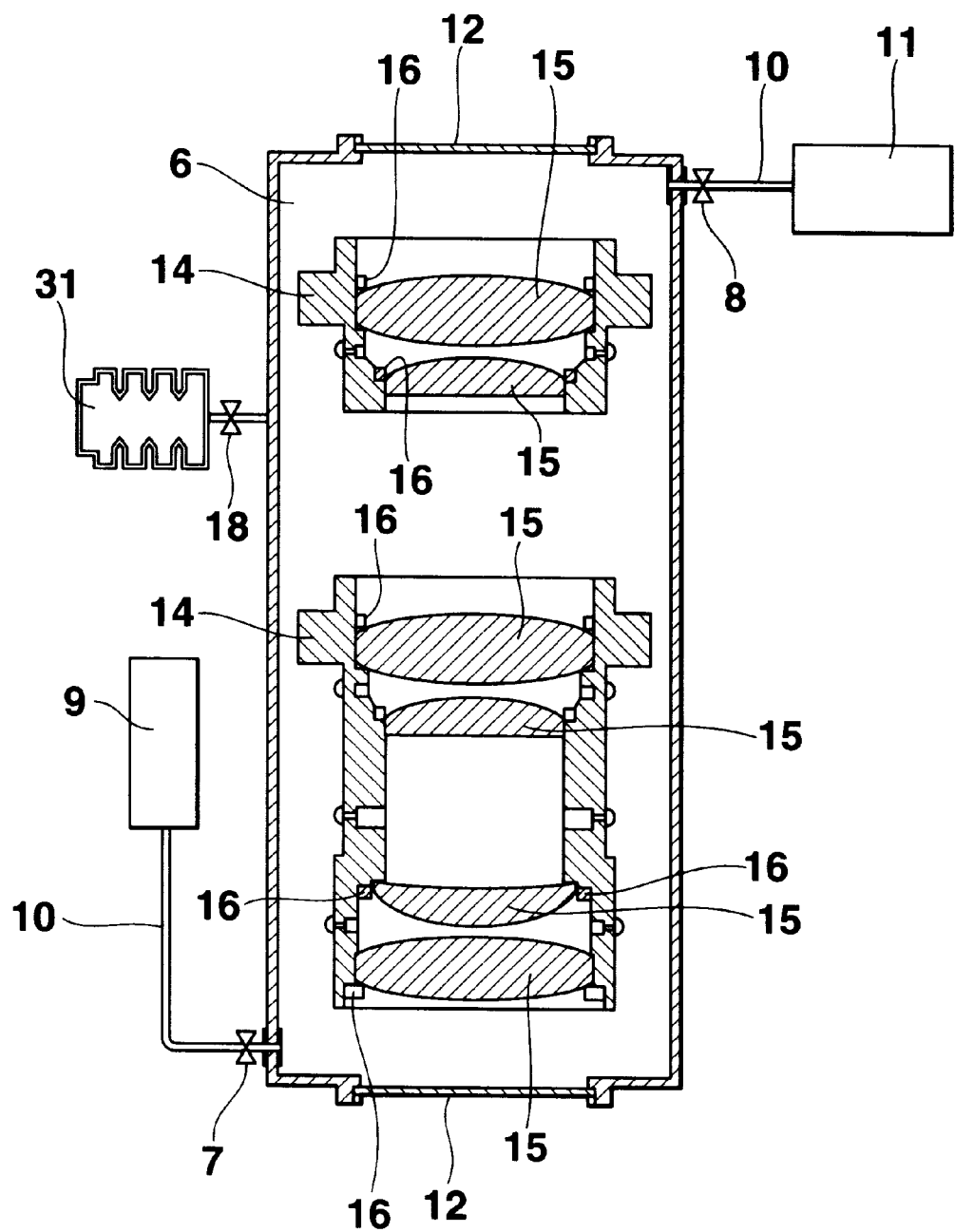
FIG. 2 shows a schematic view of a cabinet having a lens barrel according to the embodiment of the present invention.

FIG. 2 shows a schematic view of one of the cabinets 6b, 6d, 6f, 6h, 6j and 6k. A representative cabinet 6 has a gas supply port with a supply valve 7 for supplying a dry inert gas (or one having a low oxygen content) into the cabinet 6, and a discharge port with a discharge valve 8 for discharging the inert gas from the cabinet 6. The cabinet 6 has a window (e.g., a glass plate) 12 on each end to introduce and to emit the exposure light, respectively. Each lens barrel 14 holds lenses 15 using a sealing compound 16 to maintain airtightness. Also, a pressure absorber 31, made of, for example, elastic members having a flexible structure and a flexible internal capacity, is capable of being connected to the cabinet 6 through a valve 18. The pressure absorber 31, comprising a passive deformable structure such as a bellows, rubber balloon, rubber membrane, a spring pump, etc., serves to automatically maintain the differential pressure between the inside and outside of the cabinet 6 to be low (or to prevent the pressure from becoming high), despite an atmospheric pressure variation from outside. As the inert gas, it is possible to use one selected from the group consisting of nitrogen, helium, neon, argon, krypton, xenon, radon, etc. Among these gases, nitrogen or argon is preferably used, since it is relatively inexpensive and easy to obtain.

The surfaces inside of the pressure absorber 31 are preferably treated to maintain their chemical integrity and to protect them from reacting with, for example, the exposure light. A fluorine resin coating applied over the surfaces inside of the pressure absorber 31 is a preferable solution. Polytetrafluoroethene (i.e., Teflon®) is another acceptable material. These surfaces should not, however, be treated with a material selected from at least one of an organosilicon compound, ammonia, a sulfate ion (e.g., ionized sulfuric acid), an organic gas and organic matter. The pressure absorber 31 is detachable and may be attached during at least one of transportation and a long time storage of the apparatus. Although the pressure absorber is typically detached when it is installed in a clean room, it is possible to affix it permanently.

The inert (or low-oxygen content) gas supplied from the supply tank 9 flows through the gas-passageway 10 via the supply valve 7 into the cabinet 6, and the gas within the cabinet 6 flows out via the discharge valve 8 to the recovery tank 11. After the inner space of the cabinet 6 is filled (purged) with the inert gas, the discharge valve 8 is closed first, then the supply valve 7 is closed. Consequently, the cabinet 6 will be filled with a dry pure inert gas or one having a low-oxygen content, and the invasion of at least one of an organosilicon compound, ammonia, a sulfate ion (e.g., ionized sulfuric acid), an organic gas and organic matter is prevented.

Figure 3:
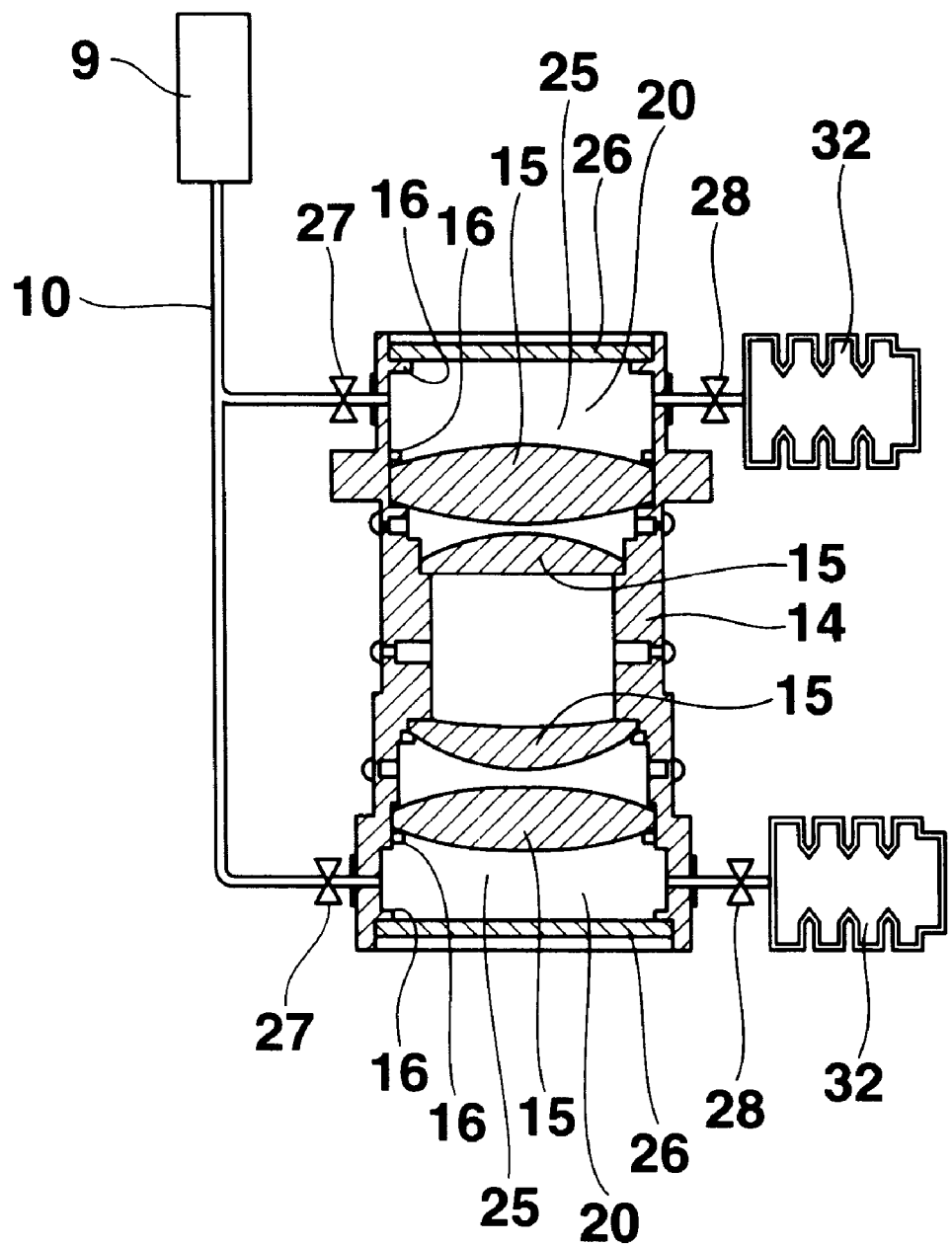
FIG. 3 shows a schematic view of one example of the lens barrel according to the embodiment of the present invention.

FIG. 3 shows in more detail one of the lens barrel units stored in the cabinet 6. As shown in FIG. 3, two sealing attachments 26 are capable of being attached on each end of the lens barrel 14 so as to provide airtight spaces 20 around the most outer of the lens surfaces 25, during at least one of transportation and storage. Sealing components 16 (made of rubber or sealant) help to keep the hermeticity. These airtight spaces 20 allow the lens surfaces 25 to be isolated from the air outside, including oxygen, which may cause deposition of clouding material on the lens surfaces 25. Each space 20 is capable of being filled with the inert gas independently through a supply valve 27, and using a discharge valve 28 connected to a pressure absorber 32 having the same structure and the same function as those of the pressure absorber 31 described above. The pressure absorber 32 is detachable and is attached at least during one of transportation and long time storage. Although the pressure absorber 32 is detached when it is installed in a clean room, it is possible to affix it permanently.

Figure 4:
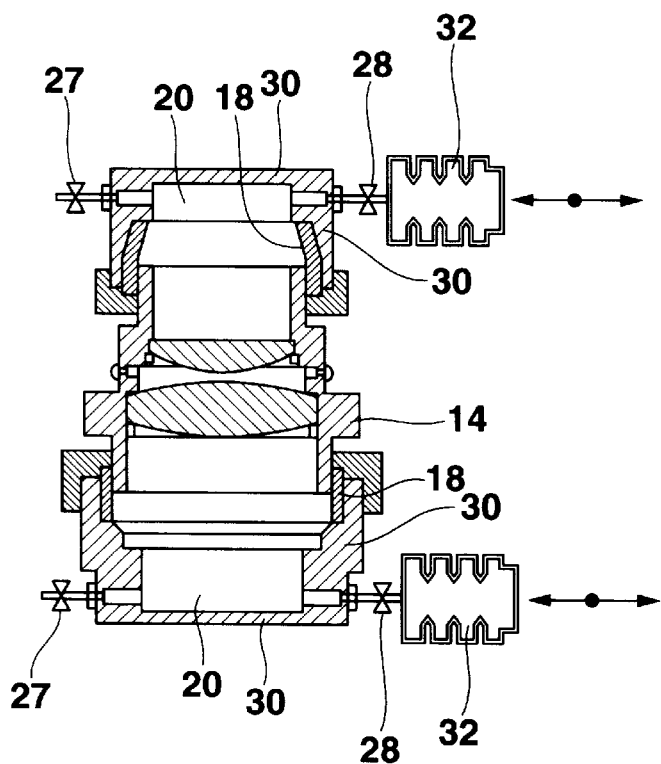
FIG. 4 shows a schematic view of another example of the lens barrel according to the embodiment of the present invention.

FIG. 4 shows another example of the lens barrel 14, which is suitable for safe transportation or safe storage. In this lens barrel 14, instead of using attachments 26 shown in FIG. 3, rigid attachments 30, each having a gas supply and a gas discharge port, are attached on each side of the lens barrel 14. Also, ring-shaped sealing members 18, made of rubber or the like, are provided between the lens barrel 14 and the attachments 30 to keep spaces 20 airtight. Since the contact surface of each of the attachments 30 has a tapered shape, it is easy to attach and detach the attachment 30 on the lens barrel 14. The pressure absorbers 32 absorb the atmospheric pressure variations in order to keep the differential pressure constant.

Figure 5:
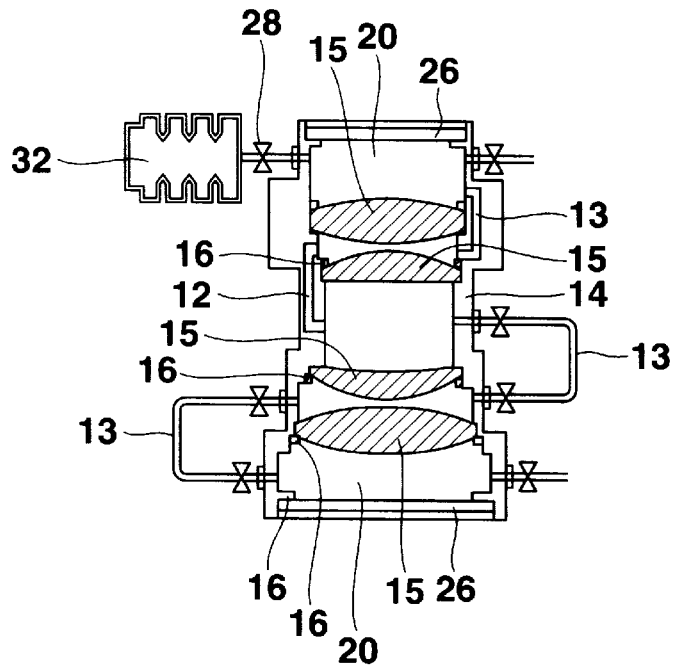
FIG. 5 shows a schematic view of yet another example of the lens barrel according to the embodiment of the present invention.

FIG. 5 shows yet another example of the lens barrel 14. In this lens barrel 14, all five spaces in the barrel, defined by four lenses 15 and two attachments 26, are connected by gas-passageways 13. Therefore, the spaces 20 can be regarded as being one continuous space having the same inner pressure, with the pressure absorber 32 being connected to one of the spaces 20. Further, instead of connecting the pressure absorber 32 using flexible tubes, the gas-passageways 13 can be another solution being regarded as a pressure absorber.

Now, it will be discussed how to utilize the above-mentioned apparatus when atmospheric pressure variations are expected, e.g., during air transportation or during long time storage.

When the optical cabinet 6 shown in FIG. 2 is shipped alone, without being built into an exposure apparatus, or when the exposure apparatus including the optical cabinet 6 is shipped, the following steps will be utilized. After the cabinet 6 is filled with the inert gas and the supply valve 7 and the discharge valve 8 are closed, the valve 18, which is connected to the pressure absorber 31, is opened. Instead of connecting the pressure absorber 31 to the valve 18, there is another approach, that is, to disconnect the gas-passageway 10 from the gas recovery tank 11 and re-connect the passageway to the pressure absorber 31. In either case, while keeping the above state, transportation or long time storage is carried out. During the transportation or long time storage, the pressure absorber 31 absorbs outer pressure variations while keeping hermeticity within the cabinet 6, so that the windows 12 and the optical elements 15 are protected from any damage caused by a high pressure difference. After the transportation or the storage, the valve 18 is closed. Then, if necessary, the pressure absorber 31 is detached.

When the lens barrel 14, as shown in any one of FIGS. 3–5, is shipped alone or is installed in the cabinet 6, or in the exposure apparatus 100, the following steps will be utilized. After filling the lens barrel 14 with the inert gas, the supply valve 27 is closed, and the valves 28, which are connected to the pressure absorbers 32, are opened. While keeping the above state, transportation or long time storage is carried out. During the transportation or long time storage, the pressure absorbers 32 absorb outer pressure variations while keeping hermeticity, so that the optical elements held by the lens barrel 14 are protected from any damage caused by a high pressure difference. After the transportation or the storage, the valve 28 is closed. Then, if necessary, the pressure absorber 32 is detached.

Figure 6:
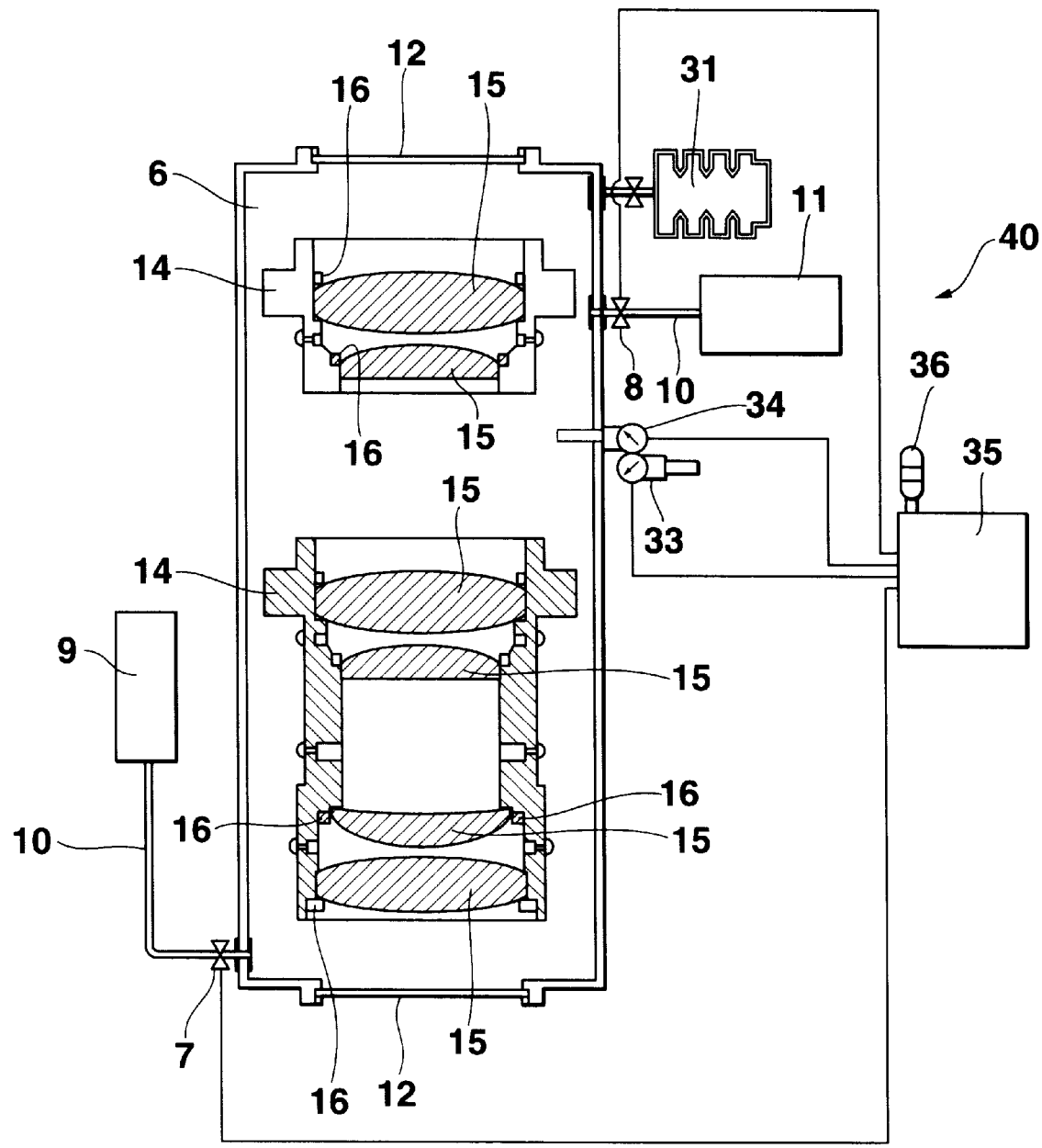
FIG. 6 shows a structure of a cabinet having a lens barrel according to another embodiment of the present invention.

FIG. 6 shows another embodiment of the optical cabinet 6, which may be included in the exposure apparatus 100 as shown in FIG. 1, in which parts similar to those previously described with reference to FIG. 2 are denoted by the same reference numerals. As compared to the embodiment shown in FIG. 2, this optical cabinet 6 comprises a sensor unit 40 to detect differential pressure between the inside and outside of the cabinet 6. The sensor unit 40 includes an inner pressure sensor 34 that detects an inner pressure of the cabinet 6, and an outer pressure sensor 33 that detects an outer pressure of the cabinet 6. These pressure sensors work continuously or at a predetermined sampling rate. A controller 35 monitors outputs of each of the sensors 33, 34 and controls the supply valve 7 and discharge valve 8 based on the outputs. Incidentally, it is possible to omit the sensor 34, because, during transportation, most pressure variations are caused by atmospheric pressure, which is detected by the sensor 33.

If the sensor 34 output exceeds the sensor 33 output by a predetermined value, the controller 35 controls the discharge valve 8 to open for discharging the inner gas out of the cabinet 6 until the differential value (differential pressure) reaches zero or less than the predetermined value, and then closes the discharge valve 8. In contrast, if the sensor 33 output exceeds the sensor 34 output by the predetermined value, the controller 35 controls the supply valve 7 to open for supplying the gas into the cabinet 6 until the differential value (differential pressure) reaches zero or less than the predetermined value, and then closes the supply valve 7.

The controller 35 also monitors the differential pressure to warn an operator if the differential pressure exceeds the predetermined value by emitting beeping tones, flashing a light 36, indicating on a console display, etc. It is also possible to let the operator manually control valves 7,8 according to the warning, instead of using the automatic electrical control.

For the purpose of coping with no power supply, the system utilizes a pressure absorber 31 as a passive absorber. The pressure absorber 31 is detachable and is attached during at least one of transportation and long time storage. Although the pressure absorber 31 is detached when it is installed in a clean room, it is possible to affix it permanently. However, since the above electrical control system serves as a passive pressure absorber, it may not be necessary to provide the passive pressure absorber 31, as long as the electrical power can be supplied continuously, e.g., by utilizing an airplane surplus power outlet.

Furthermore, in FIG. 6, it is possible to supply inert gases into the cabinet 6 as well as into the spaces in the lens barrels 14, having the same structure as denoted in one of FIG. 3 to FIG. 5, or the same structure as disclosed in Japanese Laid-Open Patent No. 9-162117. In that case, valves, to control flow of inert gases into the spaces in the lens barrel, are electrically controlled based on a pressure sensor disposed to detect the differential pressure of the spaces.

Meanwhile, when it is expected that the temperature will become significantly lower than that in a clean room during the transportation or the long time storage, the following treatment is effective to prevent condensation on the optical elements. Namely, it is possible to lower the condensation temperature by keeping the airtight spaces in the cabinet or in the lens barrel under a reduced pressure lower than one atmosphere while maintaining the hermeticity. For example, in an 0.8 atm. condition, condensation does not occur even though the temperature becomes −30° C. The decompression level should be within the maximum permissible of the differential pressure. Yet another solution is to choose a dry inert gas having a characteristic that the contained vapor amount is always lower than its maximum vapor amount (saturation) within a temperature range of, for example, −50° C. to 50° C.

Figure 7:
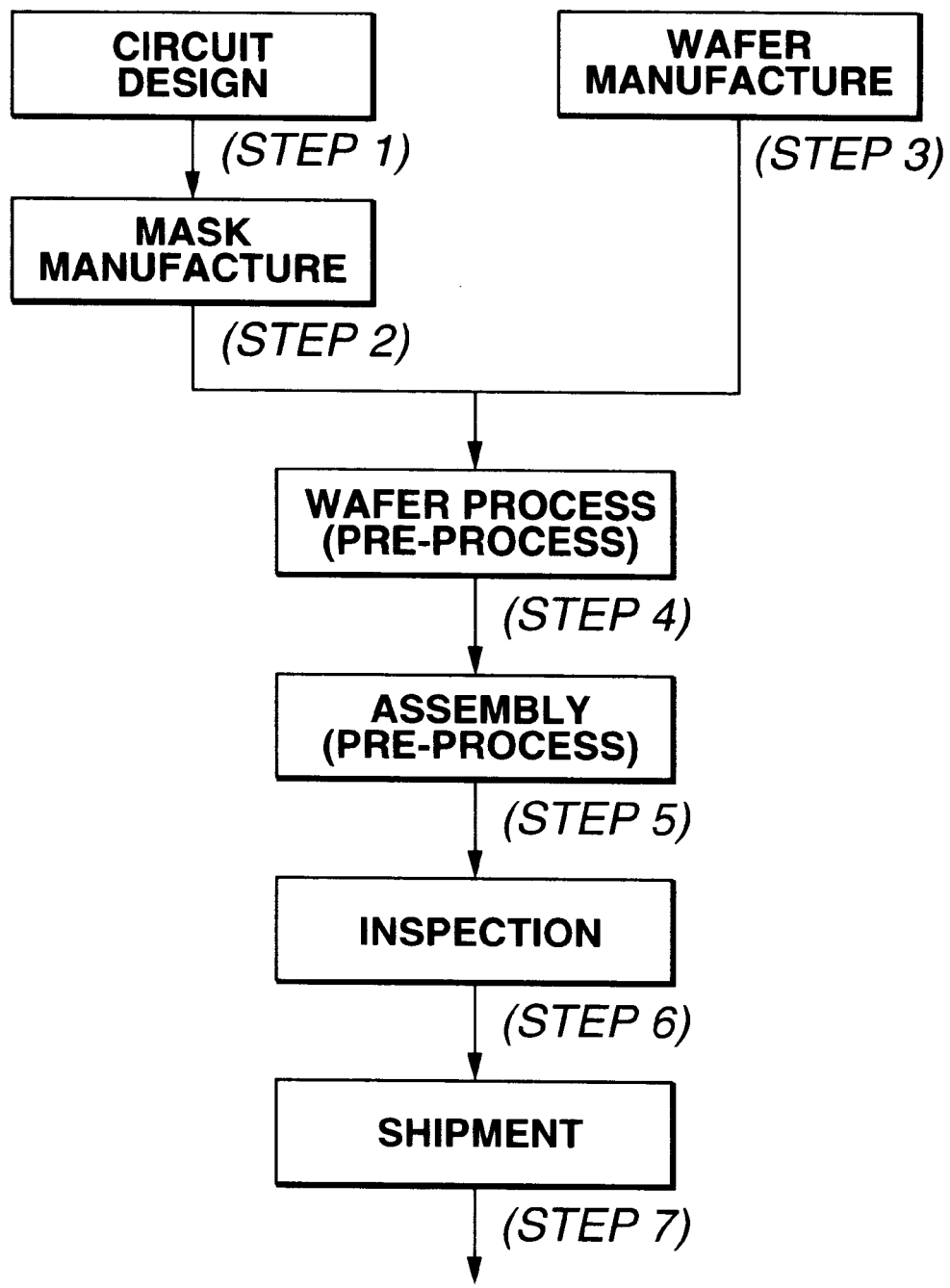
FIG. 7 is a flowchart showing a process for manufacturing micro-devices.

FIG. 7 is a flow chart showing a process for manufacturing a micro-device (e.g., a semiconductor chip such as an IC or an LSI, a liquid crystal panel, a CCD (charge-coupled device), a thin film magnetic head, a micro-machine or the like). At step 1 (circuit design), the circuit design of the semiconductor device is effected. At step 2 (the manufacturing of a mask), a mask, as the substrate described in the above embodiments, formed with the designed circuit pattern, is manufactured. On the other hand, at step 3 (the manufacturing of a wafer), a wafer is manufactured by the use of a material such as silicon. Step 4 (wafer process) is called a pre-process, in which by the use of the manufactured mask and wafer, an actual circuit is formed on the wafer by lithography techniques. The next step, step 5 (assembling), is called a post-process, which is a process for making the wafer manufactured at step 4 into a semiconductor chip, and includes steps such as an assembling step (dicing and bonding) and a packaging step (enclosing the chip). At step 6 (inspection), inspections such as an operation confirming test and a durability test of the semiconductor device manufactured at step 5 are carried out. Via such steps, the semiconductor device is completed, and it is delivered (step 7).

Figure 8:
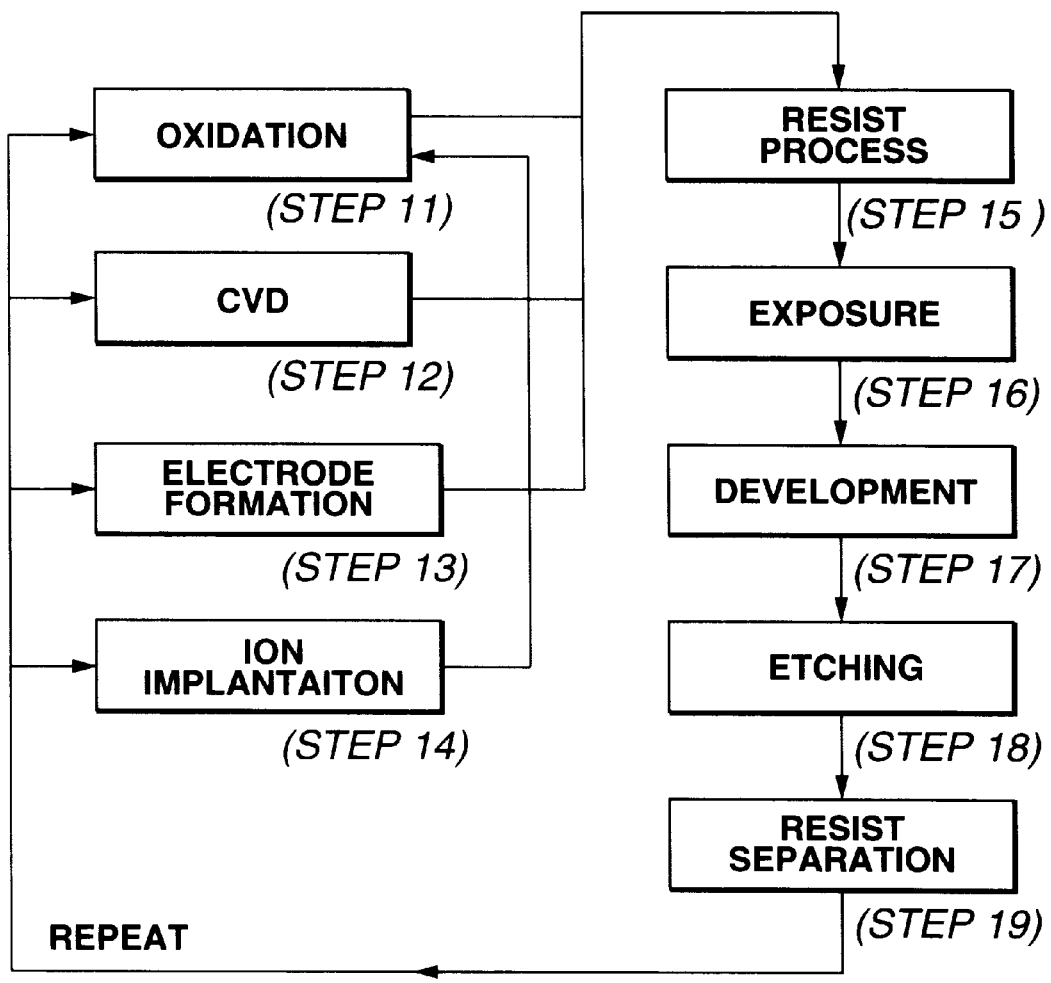
FIG. 8 is a flowchart showing the detailed steps of the wafer process in the micro-device manufacturing process shown in FIG. 7.

FIG. 8 is a flow chart showing the detailed steps of the wafer process discussed above with respect to step 4. At step 11 (oxidation), the surface of the wafer is oxidized. At step 12 (chemical vapor deposition—CVD), an insulating film is formed on the surface of the wafer. At step 13 (the forming of an electrode), an electrode is formed on the wafer by vapor deposition. At step 14 (ion implantation), ions are implanted into the wafer. At step 15 (resist processing), a photo-resist is applied to the wafer. At step 16 (exposure), the circuit pattern of the mask is printed and exposed onto the wafer by the exposure apparatus. At step 17 (development), the exposed wafer is developed. At step 18 (etching), the portions other than the developed resist image are removed. At step 19 (the peeling-off of the resist), the resist, which has become unnecessary after the etching, is also removed. By repetitively carrying out these steps, circuit patterns are superposedly formed on the wafer. If the manufacturing method of the present embodiment is used, it will be possible to manufacture semiconductor devices having a high degree of integration, which have heretofore been difficult to manufacture.

Except as otherwise disclosed herein, the various components shown in outline or in block form in the figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An optical apparatus, comprising:
   an optical system having optical elements;
   an enclosure, enclosing said optical system, for keeping a gas-tight environment inside said enclosure; and
   a pressure absorber, attached to said enclosure, which absorbs variations in differential pressure between the inside and the outside of said enclosure, while maintaining the gas-tight environment in said enclosure during at least one of transportation and storage of the optical apparatus.

2. An apparatus according to claim 1, wherein said optical system is a projection optical system of an exposure apparatus.

3. An apparatus according to claim 1, wherein said optical system is an illumination optical system of an exposure apparatus.

4. An apparatus according to claim 1, further comprising at least one lens barrel holding a plurality of lenses, and wherein said enclosure comprises a cabinet which contains said at least one lens barrel.

5. An apparatus according to claim 4, wherein said cabinet has a window on each end.

6. An apparatus according to claim 4, wherein said lens barrel has at least one internally enclosed space.

7. An apparatus according to claim 6, wherein said lens barrel includes an attachment to provide at least one enclosed space surrounding an outer surface of an outermost lens.

8. An apparatus according to claim 6, wherein said lens barrel has a plurality of said spaces, each connected by gas-passageways.

9. An apparatus according to claim 1, wherein said pressure absorber comprises a passive deformable structure.

10. An apparatus according to claim 9, wherein said pressure absorber comprises one of a bellows, a rubber balloon, a rubber membrane and a spring pump.

11. An apparatus according to claim 9, wherein at least one surface of said pressure absorber is treated with a fluorine resin.

12. An apparatus according to claim 1, wherein said pressure absorber comprises a pressure detector which detects the differential pressure, and a pressure regulator which regulates the pressure inside of said enclosure based an output of said pressure detector.

13. An apparatus according to claim 1, wherein said enclosure is filled with a low-oxygen content gas during at least one of transportation and storage.

14. An apparatus according to claim 1, wherein the inside of the enclosure is filled with an inert gas during at least one of transportation and storage.

15. An apparatus according to claim 1, wherein said pressure absorber is detachable and is attached during at least one of transportation and storage, and is detached when said apparatus is installed in a clean room.

16. An optical apparatus, comprising:

a lens barrel which holds a plurality of lenses;

an attachment being capable of being attached to an end of said lens barrel in order to provide a gas-tight enclosure around an outer surface of an outermost lens; and a pressure absorber, attached to said enclosure, which absorbs variations in differential pressure between the inside and the outside of said enclosure while maintaining the gas-tight environment in said enclosure.

17. An apparatus according to claim 16, wherein said lens barrel is a part of a projection optical system of an exposure apparatus.

18. An apparatus according to claim 16, wherein said lens barrel is a part of an illumination optical system of an exposure apparatus.

19. An apparatus according to claim 16, further comprising a cabinet which contains said lens barrel.

20. An apparatus according to claim 19, wherein said cabinet has a window on each end.

21. An apparatus according to claim 16, wherein said lens barrel has a plurality of spaces defined by the lenses, each of the spaces being connected by gas-passageways.

22. An apparatus according to claim 16, wherein said pressure absorber comprises a passive deformable structure.

23. An apparatus according to claim 22, wherein said pressure absorber comprises one of a bellows, a rubber balloon, a rubber membrane and a spring pump.

24. An apparatus according to claim 16, wherein at least one surface of said pressure absorber is treated with a fluorine resin.

25. An apparatus according to claim 16, wherein the enclosure is filled with a low-oxygen content inert gas during at least one of transportation and storage.

26. An apparatus according to claim 16, wherein said pressure absorber is detachable, and is attached during at least one of transportation and storage, and is detached when said apparatus is installed in a clean room.

27. A method of transporting an optical apparatus, said method comprising:

storing an optical system in a gas-tight enclosure;

connecting a pressure absorber to the enclosure, the pressure absorber absorbing variations in differential pressure between the inside and the outside of the enclosure;

filling the enclosure with a low-oxygen content gas; and transporting the enclosure while maintaining the gas-tight environment in the enclosure.

28. A method according to claim 27, wherein the gas is an inert gas.

29. A method according to claim 27, wherein the optical system comprises a lens barrel which holds a plurality of lenses, and further comprising attaching an attachment to an end of the lens barrel in order to provide the enclosure around an outer lens surface of an outermost lens.

30. A method of transporting an optical apparatus, said method comprising:

providing an optical system in a gas-tight enclosure;

filling the enclosure with a dry inert gas; and transporting the enclosure while maintaining the gas-tight environment in the enclosure, under a reduced pressure environment.

* * * * *